(12) United States Patent
Sudo et al.

(10) Patent No.: US 8,936,685 B2
(45) Date of Patent: Jan. 20, 2015

(54) VITREOUS SILICA CRUCIBLE FOR PULLING SILICON SINGLE CRYSTAL AND METHOD OF MANUFACTURING THE SAME

(75) Inventors: Toshiaki Sudo, Akita (JP); Makiko Kodama, Akita (JP); Minoru Kanda, Akita (JP); Hiroshi Kishi, Akita (JP)

(73) Assignee: Japan Super Quartz Corporation, Akita-Shi (JP)

( * ) Notice: Subject to any disclaimer, the term of this patent is extended or adjusted under 35 U.S.C. 154(b) by 182 days.

(21) Appl. No.: 13/394,284

(22) PCT Filed: Aug. 20, 2010

(86) PCT No.: PCT/JP2010/064053
§ 371 (c)(1),
(2), (4) Date: Mar. 5, 2012

(87) PCT Pub. No.: WO2011/030657
PCT Pub. Date: Mar. 17, 2011

(65) Prior Publication Data
US 2012/0160159 A1 Jun. 28, 2012

(30) Foreign Application Priority Data
Sep. 10, 2009 (JP) ................. 2009-208853

(51) Int. Cl.
*C30B 15/10* (2006.01)
*C03B 19/09* (2006.01)
(Continued)

(52) U.S. Cl.
CPC .............. *C03B 19/095* (2013.01); *C30B 15/10* (2013.01); *C30B 29/06* (2013.01); *C30B 35/002* (2013.01); *C30B 29/18* (2013.01)
USPC ................ 117/208; 117/13; 65/17.3

(58) Field of Classification Search
CPC ....................................................... C30B 15/10
USPC .......................................................... 117/208
See application file for complete search history.

(56) References Cited

U.S. PATENT DOCUMENTS 5,306,388 A * 4/1994 Nakajima et al. ............. 117/208
5,976,247 A 11/1999 Hansen et al.
(Continued)

FOREIGN PATENT DOCUMENTS

| JP | 01-197381 A | 8/1989 |
| JP | 01-261293 A | 10/1989 |

(Continued)

OTHER PUBLICATIONS

International Search Report for PCT/JP2010/064053; mailed Nov. 2, 2010.

*Primary Examiner* — Michael Kornakov
*Assistant Examiner* — Hua Qi
(74) *Attorney, Agent, or Firm* — Law Office of Katsuhiro Arai (57) ABSTRACT

The present invention provides a vitreous silica crucible which can suppress the sidewall lowering of the crucible under high temperature during pulling a silicon single crystal, and a method of manufacturing such a vitreous silica crucible. The vitreous silica crucible 10 includes an opaque vitreous silica layer 11 provided on the outer surface side of the crucible and containing numerous bubbles, and a transparent vitreous silica layer 12 provided on the inner surface side. The opaque vitreous silica layer 11 includes a first opaque vitreous silica portion 11a provided on the crucible upper portion, and a second opaque vitreous silica portion 11b provided on the crucible lower portion. The specific gravity of the second opaque vitreous silica portion 11b is 1.7 to 2.1, and the specific gravity of the first opaque vitreous silica portion 11a is 1.4 to 1.8, and smaller than that of the second opaque vitreous silica portion. The particle size distribution of the material silica powder for the first opaque vitreous silica portion 11a is wider than that of the second opaque vitreous silica portion 11b, and the material silica powder for the first opaque vitreous silica portion 11a includes more fine powder than that for the second opaque vitreous silica portion 11b.

6 Claims, 6 Drawing Sheets

(51) Int. Cl.
*C30B 29/06* (2006.01)
*C30B 35/00* (2006.01)
*C30B 29/18* (2006.01)

(56) References Cited

U.S. PATENT DOCUMENTS

2006/0236916 A1* 10/2006 Ohama ............................ 117/13
2007/0082149 A1* 4/2007 Linnot et al. ................. 428/34.4
2011/0011334 A1 1/2011 Shimazu et al.

FOREIGN PATENT DOCUMENTS

| | | | |
|---|---|---|---|
| JP | 01-275496 A | 11/1989 | |
| JP | 06-329493 A | 11/1994 | |
| JP | 09-110590 A | 4/1997 | |
| JP | 10-203893 A | 8/1998 | |
| JP | 2001-328831 A | 11/2001 | |
| JP | 2005-330157 A | 12/2005 | |
| JP | 2005330157 A * | 12/2005 | .............. C30B 15/10 |
| WO | 2009/107834 A1 | 9/2009 | |

* cited by examiner

VITREOUS SILICA CRUCIBLE FOR PULLING SILICON SINGLE CRYSTAL AND METHOD OF MANUFACTURING THE SAME

TECHNICAL FIELD

The present invention relates to a vitreous silica crucible for pulling a silicon single crystal and a method of manufacturing the same, and in particular, relates to the cross-section structure in the height direction of the vitreous silica crucible.

BACKGROUND ART

A vitreous silica crucible is used for manufacturing a silicon single crystal. In the Czochralski method (the CZ method), polysilicon is charged into the vitreous silica crucible, and heated and melted to produce silicon melt. Thereafter, a seed crystal is dipped into the silicon melt, and the seed crystal is gradually pulled while rotating the crucible and the seed crystal in the opposite direction to grow a single crystal. In order to manufacture a high-purity silicon single crystal for a semiconductor device, it is required that a silicon single crystal is not contaminated by dissolution of impurities contained in the vitreous silica crucible, and it is also required that the vitreous silica crucible has sufficient heat capacity so as to easily carry out temperature control of the silicon melt. Therefore, a vitreous silica crucible having an opaque outer layer containing numerous microbubbles and a transparent inner layer whose bubble content rate is 0.1% or less (the average diameter of bubbles is 100 μm or less) is preferably used (See Patent Document 1). Furthermore, a vitreous silica crucible having two-layer structure is also used (See Patent Document 2). In such a crucible, the outer layer is formed of natural silica to enhance the high temperature structure of the crucible, and the inner layer which contacts the silicon melt is formed of synthetic silica to prevent mix-in of impurities.

Nowadays, along with enlargement of a silicon wafer, a vitreous silica crucible having an opening diameter of 700 mm or more is used. This leads to the increase of the amount of melting, long-time pulling over 100 hours or more, the increase of distance from the heater provided in the crucible to a silicon crystal, and the resultant increase of heating. These factors increases heat load to the vitreous silica crucible, and results in sidewall lowering where the lower portion of the vitreous silica crucible deforms by the crucible's own weight during pulling. In order to prevent the sidewall lowering, there is known a vitreous silica crucible whose inner surface or outer surface is strengthened by crystallization. For example, in Patent Document 3, a crystallization promoter is applied onto the crucible outer surface, and the crucible is strengthened by crystallization of the crucible during pulling. Furthermore, in Patent Document 4, oxyhydrogen flame is thrown to the crucible outer surface to form a crystallized vitreous silica layer on the crucible outer surface. Furthermore, in Patent Document 5, the entire inner surface of the vitreous silica crucible is polished by sandblast or the like, and the polished surface is subjected to heat treatment by oxyhydrogen flame for smoothing.

PRIOR ART REFERENCE

Patent Document

Patent Document 1: JP-A-Hei1-197381
Patent Document 2: JP-A-Hei1-261293
Patent Document 3: JP-A-Hei09-110590
Patent Document 4: JP-A-Hei10-203893
Patent Document 5: JP-A-2001-328831

SUMMARY OF THE INVENTION

Problems to be Solved by the Inventions

However, in a conventional crucible described in Patent Document 3, the crystallization promoter applied onto the crucible outer surface is an impurity for a silicon single crystal, and thus it can adversely affect the electrical properties of the manufactured wafer. Furthermore, according to the crucible described in Patent Document 4, the crystallized vitreous silica layer can be formed on the crucible outer surface by throwing oxyhydrogen flame to the crucible outer surface. However, when the vitreous silica is heated above the softening temperature (about 1700 degrees C.) under oxygen atmosphere, cristobalite crystal precipitates during the cooling process. Vitreous silica and cristobalite are largely different in the thermal expansion coefficient, and thus the cristobalite layer formed by this method is easily detached, and not appropriate for practical use. Furthermore, the conventional crucible described in Patent Document 5 has an inner surface not containing bubbles and having high purity, and can improve the single crystallization yield. However, the crucible does not solve the problem of the sidewall lowering where the lower portion of the vitreous silica crucible in particular deforms by the crucible's own weight.

The present invention has been made to solve the above-mentioned problem, and provides a vitreous silica crucible which can suppress the sidewall lowering of the crucible under high temperature during pulling a silicon single crystal, and a method of manufacturing the same.

Means for Solving the Problem

In order to solve the above-mentioned problem, the present inventors have made extensive research, and as a result, found the facts that (1) when the specific gravity of the opaque vitreous silica layer at the crucible upper portion is smaller than that of the crucible lower portion, the sidewall lowering which is caused by high heat load at 1500 degrees C. or more from the heater provided outside the vitreous silica crucible during pulling the silicon single crystal can be prevented, and (2) such a crucible can be easily manufactured by adjusting the particle diameter of silica powder used for the manufacturing.

The present invention has been made based on such technical findings, and provides a vitreous silica crucible having a sidewall portion, a curved portion, and a bottom portion, and having an opaque vitreous silica layer provided on an outer surface side of the crucible and containing numerous bubbles and a transparent vitreous silica layer provided on an inner surface side of the crucible, wherein the opaque vitreous silica layer has a first opaque vitreous silica portion provided on a crucible upper portion belonging to a range from a crucible upper end to a first intermediate position below the upper end, and a second opaque vitreous silica portion provided on a crucible lower portion belonging to a range from the first intermediate position to a crucible lower end or a range from a second intermediate position below the first intermediate position to the crucible lower end, a height $h_1$ of the first opaque vitreous silica portion is 0.1 $h_0$ to 0.6 $h_0$, where $h_0$ is a height of the entire crucible, a specific gravity of the second opaque vitreous silica portion is 1.7 to 2.1, and a specific gravity of the first opaque vitreous silica portion is 1.4 to 1.8, and smaller than that of the second opaque vitreous silica portion.

According to the present invention, the specific gravity of the opaque vitreous silica layer of the crucible upper portion is small, and thus the load caused by the own weight and applied to the crucible lower portion is reduced, and thus the sidewall lowering of the crucible can be suppressed. Furthermore, the opaque vitreous silica layer of the crucible upper portion contains more bubbles, and thus the heat retaining property of the crucible upper portion can be enhanced, and thus generation of cracks in a silicon single crystal by rapid cooling at a cooling rate of, for example, 3.0 degrees C. per minute can be prevented.

Furthermore, the present invention provides a method of manufacturing a vitreous silica crucible having a sidewall portion, a curved portion and a bottom portion, and having:

(1) a process of supplying silica powder into a hollow mold having an inner surface corresponding to a shape of the vitreous silica crucible while rotating the mold, to form a silica powder layer along the inner surface of the mold, and (2) a process of heating the silica powder layer to fuse the silica powder and form a vitreous silica layer, wherein the process (1) includes:

a process of supplying a first silica powder on a position corresponding to a crucible upper portion belonging to a range from a crucible upper end to a first intermediate position below the upper end, a process of supplying a second silica powder on a position corresponding to a crucible lower portion belonging to a range from the first intermediate position to a crucible lower end or a range from a second intermediate position below the first intermediate position to the crucible lower end, and a process of supplying a third silica powder on a crucible inner surface covered with the first and second silica powder, wherein a particle size distribution of the first silica powder is wider than that of the second silica powder and the first silica powder includes more fine powder than the second silica powder.

The fusing speed of silica fine powder (silica powder having relatively small particle diameter) is larger than that of silica coarse powder (silica powder having relatively large particle diameter), and the fused portion catches air taken from the atmosphere and existing between particles. That is, the air is more difficult to be released from the fused vitreous silica, and thus the bubble content rate increases. Therefore, when silica powder used for the crucible upper portion includes more fine powder, the specific gravity of the crucible upper portion decreases, and the sidewall lowering of the crucible is alleviated. Such effect by the present invention is more effective to a large-size crucible.

In the present embodiment, it is preferred that the first silica powder is natural silica powder including particles having a particle diameter of 50 μm or more and less than 250 μm in an amount of 60% or more, and the second silica powder is natural silica powder including particles having a particle diameter of 150 μm or more and less than 350 μm in an amount of 60% or more. In this case, it is in particular preferred that the particle size distribution of the first silica powder is 5 to 20% for a particle diameter of less than 50 μm, 60 to 80% for a particle diameter of 50 μm or more and less than 250 μm, and 20% or less for a particle diameter of 250 μm or more, and the particle size distribution of the second silica powder is 20% or less for a particle diameter of less than 150 μm, 60 to 80% for a particle diameter of 150 μm or more and less than 350 μm, and 10 to 20% for a particle diameter of 350 μm or more. When these silica powder used for formation of the first and second opaque vitreous silica portion satisfy the above-mentioned conditions for the particle size, the specific gravities of the crucible upper portion and the crucible lower portion can be set to an apparatus value, and thus sidewall lowering which tends to occur in a large-size crucible can be certainly prevented.

In the present invention, it is preferred that the third silica powder is synthetic silica powder including particles having a particle diameter of 200 μm or more and less than 400 μm in an amount of 50% or more. When the silica powder used for formation of a transparent vitreous silica layer provided on the inner surface side of the crucible satisfies the above-mentioned conditions, the bubble content rate does not become very high, and thus it is possible to easily form an opaque vitreous silica layer substantially not containing bubbles. Here, the phrase "substantially not containing bubbles" refers to a state that the bubble content rate and the bubble size are such that the single crystallization yield is not deteriorated due to the bubbles. Although not in particular limited, the phrase "substantially not containing bubbles" may refer to a state that the bubble content rate is 0.1% or less and the average diameter of the bubbles is 100 μm or less.

A method of manufacturing a vitreous silica crucible of the present invention includes a process of forming a transparent vitreous silica layer on an inner surface side of the crucible by, when a silica powder layer is heated to fuse silica powder, deaerating the silica powder during heating from ventilation holes provided in a mold, and a process of forming an opaque vitreous silica layer on an outer surface side of the crucible by weakening or stopping depressurization for the deaeration.

According to the present invention, it is possible to certainly form a vitreous silica crucible having an opaque vitreous silica layer provided on the outer surface side of the crucible and containing numerous bubbles, and a transparent vitreous silica layer provided on the inner surface side of the crucible and substantially not containing bubbles, and having an crucible upper portion whose opaque vitreous silica layer having a relatively small specific gravity.

The present invention exhibits the larger effect in a vitreous silica crucible having an opening diameter of 812 mm or more and for pulling a silicon single crystal. The large-size crucible having an opening diameter of 812 mm or more is used for pulling a silicon wafer ingot having a diameter of 300 mm, and has large volume and weight, and tends to cause sidewall lowering where the lower portion of the vitreous silica crucible is deformed by its own weight. However, according to the present invention, the sidewall lowering can be prevented even in a large-size crucible having an opening diameter of 812 mm, and thus it is possible to improve the yield in manufacturing a silicon single crystal.

Effect of the Invention

The present invention provides a vitreous silica crucible which can suppress the sidewall lowering of the crucible under high temperature during pulling a silicon single crystal, and a method of manufacturing such a vitreous silica crucible easily.

DESCRIPTION OF THE EMBODIMENTS

Hereinafter, with reference to the attached drawings, preferred embodiments of the present invention will be explained.

Figure 1:
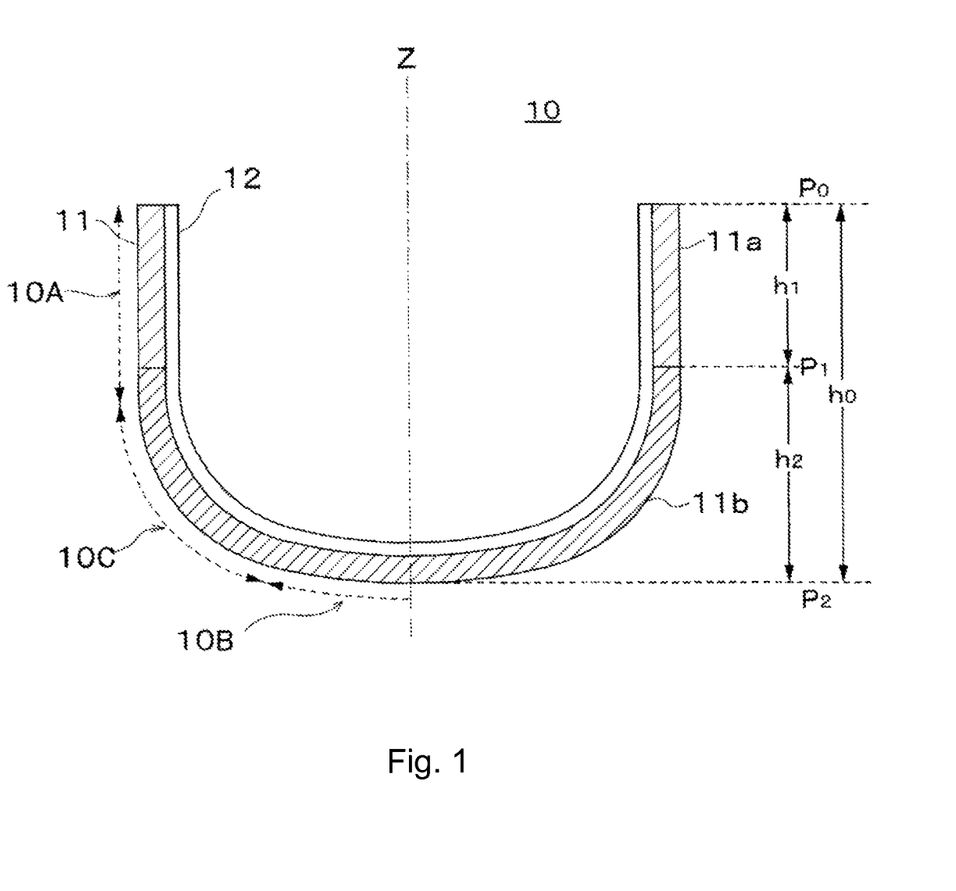
FIG. 1 is a schematic sectional view showing the structure of a vitreous silica crucible 10 of the first embodiment of the present invention.

FIG. 1 is a schematic sectional view showing the structure of a vitreous silica crucible for pulling a silicon single crystal according to the first embodiment of the present invention.

As shown in FIG. 1, the vitreous silica crucible 10 of the present embodiment has two-layer structure, and includes an opaque vitreous silica layer 11 constituting the outer layer and a transparent vitreous silica layer 12 constituting the inner layer.

The opaque vitreous silica layer 11 is an amorphous vitreous silica layer incorporating numerous microbubbles. In the present specification, "opaque" refers to a state that numerous bubbles exist in vitreous silica and the vitreous silica appears opaque. The opaque vitreous silica layer 11 has a function of uniformly conveying, to silicon melt in the vitreous silica crucible, heat from a heater disposed around the crucible. The opaque vitreous silica layer 11 has larger heat capacity than the transparent vitreous silica layer 12, and thus enables easy control of the temperature of silicon melt.

The opaque vitreous silica layer 11 includes a first opaque vitreous silica portion 11a provided on a crucible upper portion, and a second opaque vitreous silica portion 11b provided on a crucible lower portion, and the bubble content rates and the specific gravities of these portions are different from each other. Here, the "crucible upper portion" refers to a portion belonging to a region from the upper end $P_0$ to the intermediate position $P_1$ of the crucible, and the "crucible lower portion" refers to a portion belonging to a region below the "crucible upper portion" and from the intermediate position $P_1$ to the lower end $P_2$ of the crucible. When the height of the entire crucible is $h_0$, the height $h_1$ of the first opaque vitreous silica portion 11a is preferred to be 0.1 $h_0$ to 0.6 $h_0$. When $h_1$ is less than 0.1 $h_0$, there is no advantage of providing the first opaque vitreous silica portion 11a, and when $h_1$ is over 0.6 $h_0$, the crucible strength decreases and deformation of the crucible is more easily to occur.

Compared with the second opaque vitreous silica portion 11b, the first opaque vitreous silica portion 11a include more bubbles, and thus the specific gravity is smaller. Specifically, the specific gravity of the first opaque vitreous silica portion 11a is 1.4 to 1.8, and the specific gravity of the second opaque vitreous silica portion 11b is 1.7 to 2.1, and larger than that of the first opaque vitreous silica portion 11a. The difference in specific gravity therebetween is preferred to be 0.1 to 0.3, and more preferred to be 0.2 to 0.28. When the specific gravity of the first opaque vitreous silica portion 11a is small, the load applied to the crucible lower portion can be reduced, and thus the sidewall lowering where the vitreous silica crucible lower portion deforms by its own weight can be suppressed. Furthermore, the heat keeping effect of the upper space of the crucible inside can be improved, and this prevents generation of cracks in the pulled silicon single crystal due to rapid cooling. The measurement principle of the specific gravity of vitreous silica complies with the Archimedes method. An example of the testing method in JIS (Japanese Industrial Standards) is JIS Z8807.

The opaque vitreous silica layer 11 is preferred to be made of natural vitreous silica. Natural vitreous silica is vitreous silica manufactured from natural silica such as silica stone, natural quartz crystal. In general, natural silica contains metal impurities in higher concentration and OH group in lower concentration than synthetic silica. For example, for natural silica, the Al content is 1 ppm or more, and the content of each element of alkali metals (Na, K and Li) is 0.1 ppm or more, and the OH group content is less than 60 ppm. Whether silica is natural or not should not be determined based on a single factor, but should be determined based on plural factors. Natural silica has larger viscosity at high temperature than synthetic silica, and thus enhances the high temperature strength of the whole crucible. In addition, natural silica is cheaper than synthetic silica, and thus the use of natural silica is advantageous in terms of cost.

The transparent vitreous silica layer 12 is an amorphous vitreous silica layer substantially not containing bubbles. The transparent vitreous silica layer 12 prevents the increase of vitreous silica pieces detached from the crucible inner surface, and thus enhances silicon single crystallization yield. Here, the phrase "substantially not containing bubbles" refers to a state that the bubble content rate and the bubble size are such that the single crystallization yield is not deteriorated due to the bubbles. Although not in particular limited, the phrase "substantially not containing bubbles" may refer to a state that the bubble content rate is 0.1% or less and the average diameter of the bubbles is 100 μm or less. The change of the bubble content rate from the opaque vitreous silica layer 11 to the transparent vitreous silica layer 12 is relatively abrupt. At a position approximately 30 μm from a position where the bubble content rate of the transparent vitreous silica layer 12 starts to increase, the bubble content rate reaches that of the opaque vitreous silica layer 11. Therefore, the boarder between the opaque vitreous silica layer 11 and the transparent vitreous silica layer 12 is clear and can be easily visually distinguished.

The bubble content rate of the transparent vitreous silica layer 12 can be measured nondestructively by use of an optical detection unit. The optical detection unit includes a light-receiving apparatus which can receive the reflected light from the inner surface and the near-surface region of the measuring vitreous silica crucible. The light-emitting apparatus may be integrated into the optical detection unit, and an external light-emitting unit may be utilized. Furthermore, the optical detection unit may be rotatable so that measurement along the inner surface of the vitreous silica crucible is enabled. As the irradiation light, any light such as visible light, ultraviolet and infrared light, and X-ray and laser light may be used as long as bubbles can be detected by the reflection of the light. The light-receiving apparatus can be selected depending on the irradiation light, and is, for example, an optical camera having an optical lens and an image pickup unit. Bubbles existing in a certain depth from the surface can be detected by moving the focus of the optical lens from the surface to the depth.

The measurement result by the optical detection unit is inputted into an image processing device, and the bubble content rate P (%) is calculated. Specifically, the image of the crucible inner surface is taken by use of an optical camera, and the crucible inner surface is divided into unit areas S1. The area S2 occupied by bubbles is determined for each unit area S1, and the bubble content rate P (%) is calculated from P(%)=(S2/S1)*100.

The transparent vitreous silica layer 12 is preferred to be made of synthetic vitreous silica. Synthetic vitreous silica is vitreous silica manufactured by fusing material synthesized, for example, by hydrolysis of silicon alkoxide. In general, synthetic silica contains metal impurities in lower concentration and OH group in higher concentration than natural silica. For example, for synthetic silica, the content of each element of metal impurities is less than 0.05 ppm, and the OH group content is 30 ppm or more. However, synthetic silica containing metal impurities such as Al is also known. Thus, whether silica is synthetic or not should not be determined based on a single factor, but should be determined based on plural factors. Synthetic vitreous silica contains impurities in lower concentration than natural vitreous silica, and thus prevents the increase of impurities released into silicon melt from the crucible, and thus enhances silicon single crystallization yield.

The opaque vitreous silica layer 11 and the transparent vitreous silica layer 12 are provided on the entire crucible from the sidewall portion 10A to the bottom portion 10B. The sidewall portion 10A is a cylindrical portion parallel to a crucible central axis (Z axis), and extends substantially vertically from the crucible opening. However, the sidewall portion 10A is not necessarily completely parallel, and it may be gradually widened toward the opening. Furthermore, the sidewall portion 10A may be linear, and may be gradually curved. Although not limiting, the sidewall portion 10A may be defined as a region of a crucible wall whose tangential line has an angle of 80 degrees or more with respect to XY plane which is perpendicular to Z axis.

The bottom portion 10B of the crucible is a relatively flat portion containing a point of intersection with Z axis of the crucible. A curved portion 10C is provided between the bottom portion 10B and the sidewall portion 10A. The bottom portion 10B is preferred to cover the plane of projection of the pulled silicon single crystal. The shape of the bottom portion 10B may have a rounded or flat bottom. The curvature and angle of the curved portion 10C may be set discretionarily. When the crucible bottom portion 10B has a rounded bottom, the bottom portion 10B also has a certain curvature, and thus the difference in curvature between the bottom portion 10B and the curved portion 10C is much smaller compared with the case when the bottom portion 10B has a flat bottom. When the bottom portion 10B has a flat bottom, the bottom portion 10B has a flat or extremely gradually curved surface, and the curvature of the curved portion 10C is very large. In the case of the flat bottom, the bottom portion 10B is defined as a region of a crucible wall whose tangential line has an angle of 30 degrees or less with respect to XY plane which is perpendicular to Z axis.

The wall thickness of the crucible is preferred to be 10 mm or more, and more preferred to be 13 mm or more. Usually, the wall thickness of a large-size crucible having an opening diameter of 812 mm (32 inches) or more is 10 mm or more, and the wall thickness of a large-size crucible having an opening diameter of 1016 mm (40 inches) is 13 mm or more. These large-size crucibles are used for large-volume and long-time pulling, and thus the sidewall lowering tends to occur, and thus the effect of the present invention is eminent in such crucibles. The wall thickness of the crucible is not necessarily constant from the sidewall portion 10A to the bottom portion 10B, and for example, the crucible may be configured so that the wall thickness is the largest at the curved portion 10C, and the wall thickness decreases toward the upper end of the sidewall portion 10A or the center of the bottom portion 10B.

The thickness of the transparent vitreous silica layer 12 is preferred to be 0.5 mm or more, and more preferred to be 1.0 mm or more. When the transparent vitreous silica layer 12 is thinner than 0.5 mm, it may occur that the transparent vitreous silica layer 12 is totally corroded and the opaque vitreous silica layer 11 is exposed during pulling a silicon single crystal. The thickness of the transparent vitreous silica layer 12 does not need to be constant from the sidewall portion 10A to the bottom portion 10B, and for example, the crucible may be configured so that the thickness of the transparent vitreous silica layer 12 is the largest at the curved portion 10C, and the thickness decreases toward the upper end of the sidewall portion 10A or the center of the bottom portion 10B.

As explained above, according to the present embodiment, the first opaque vitreous silica portion 11a of the crucible upper portion has smaller specific gravity than the second opaque vitreous silica portion 11b of the crucible lower portion, and thus the sidewall lowering of the crucible, which is caused by enlargement of the crucible, can be suppressed. Furthermore, the first opaque vitreous silica portion 11a contains more bubbles, and thus the heat retaining property of the crucible upper portion can be enhanced, and thus the crucible retains heat of the silicon single crystal during pulling, and generation of cracks by rapid cooling can be prevented.

Next, with respect to FIG. 2 to FIG. 4, a method of manufacturing the vitreous silica crucible 10 will be explained.

Figure 2:
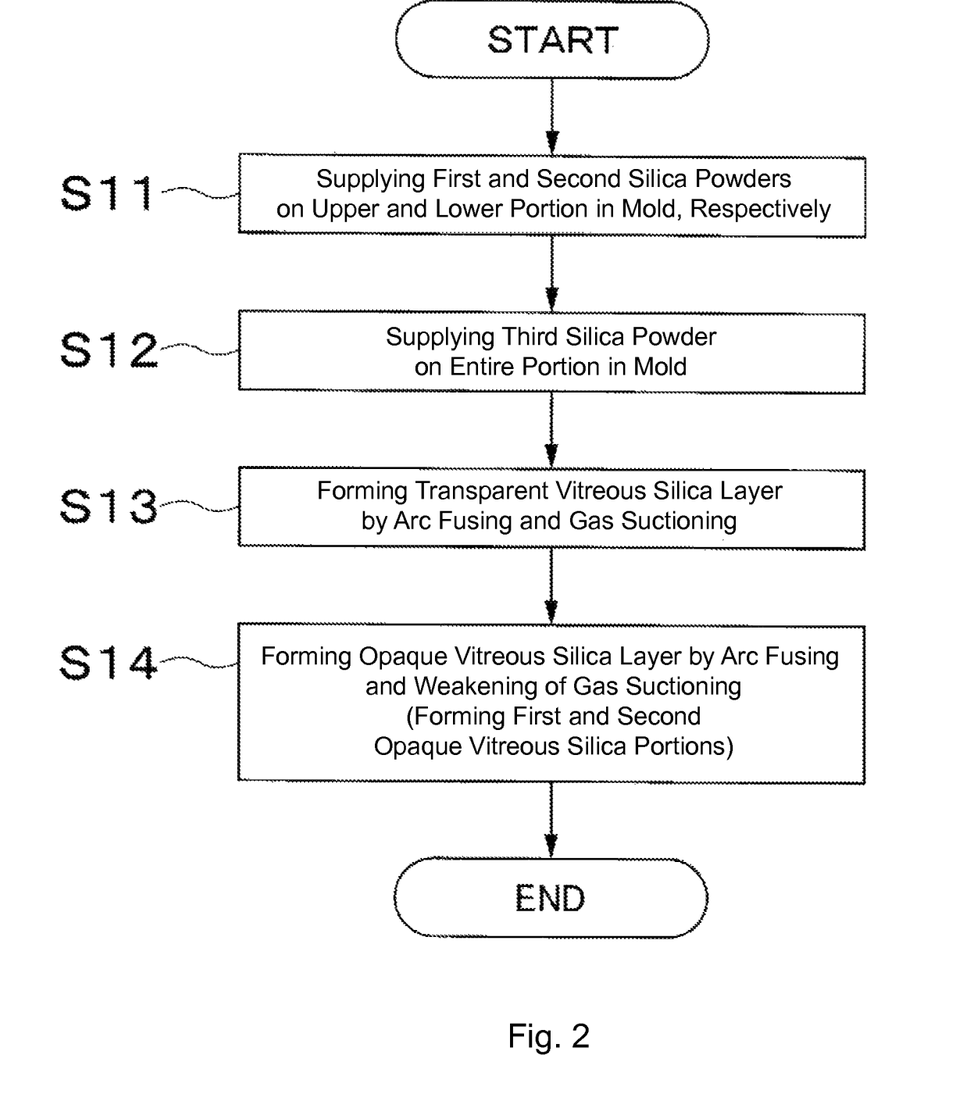
FIG. 2 is a flowchart for explaining a method of manufacturing a vitreous silica crucible.
Figure 3:
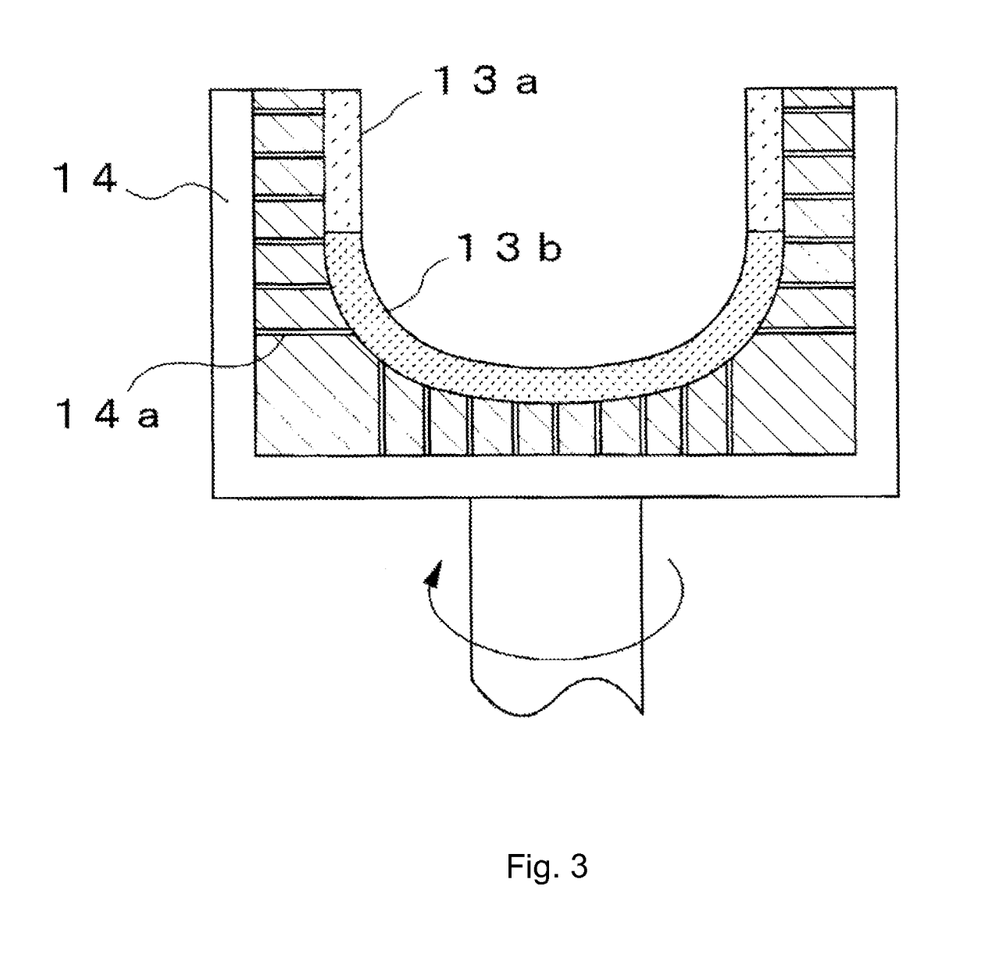
FIG. 3 is a schematic view for explaining a method of manufacturing the vitreous silica crucible 10.
Figure 4:
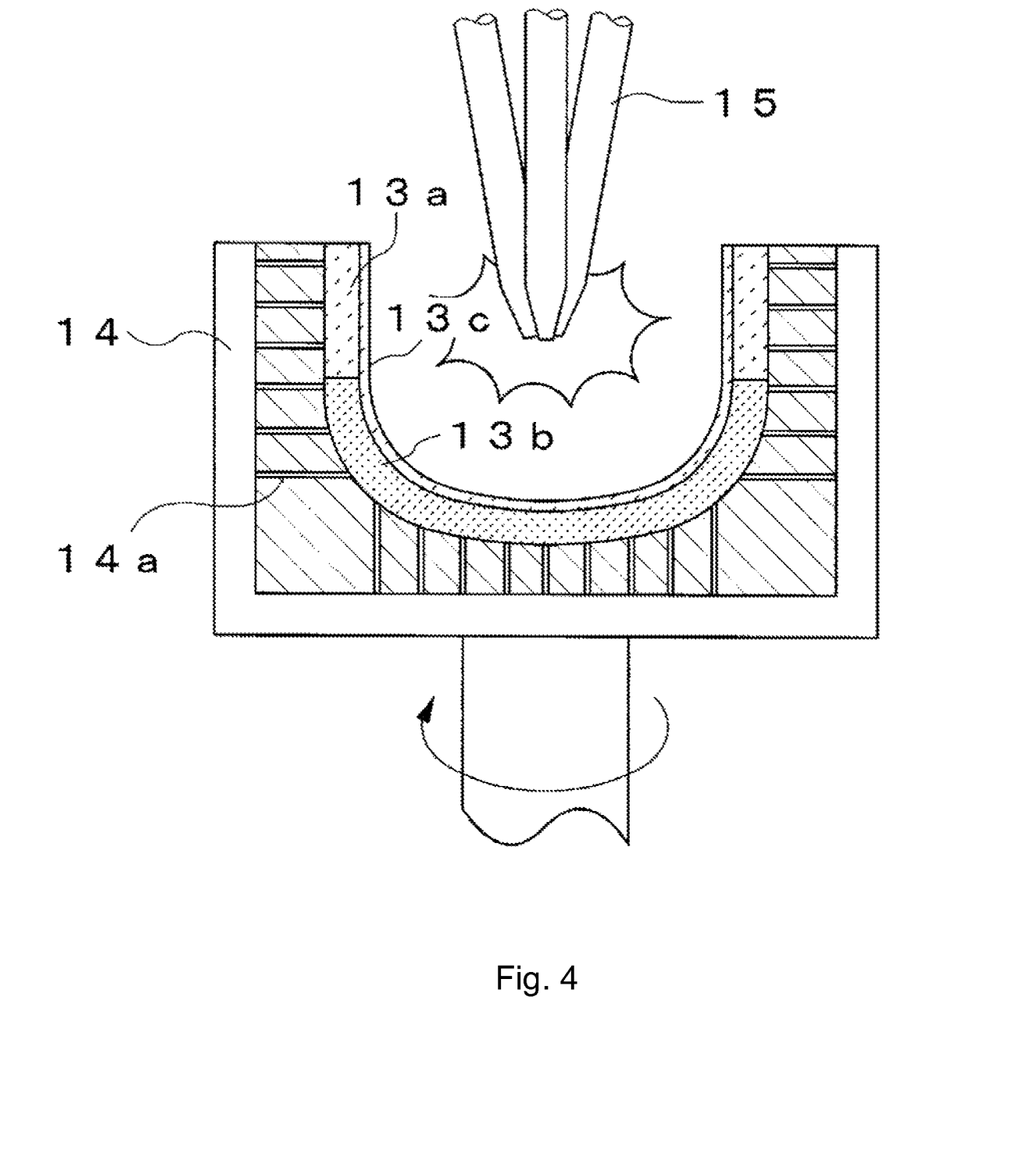
FIG. 4 is a schematic view for explaining a method of manufacturing the vitreous silica crucible 10.

FIG. 2 is a flowchart schematically showing the manufacturing process of the vitreous silica crucible 10, and FIG. 3 and FIG. 4 are schematic views for explaining the method of manufacturing the vitreous silica crucible 10.

The vitreous silica crucible 10 can be manufactured by use of the rotating mold method. In the rotating mold method, as shown in FIG. 3, a carbon mold 14 having a cavity corresponding to the outer shape of the vitreous silica crucible 10 is prepared, and silica powder is supplied to the mold 14 while rotating the mold 14 to form a silica powder layer along the inner surface of the mold. At this stage, first silica powder 13a is supplied to a cavity upper portion corresponding to the crucible upper portion, and second silica powder 13b is supplied to a cavity lower portion corresponding to the crucible lower portion (Step S11). The order of supplying the first and second silica powders 13a, 13b is not in particular limited specified. The carbon mold 14 rotates at a constant rate, and the supplied silica powder is retained on a specific position in the inner surface of the mold by the centrifugal force, and the shape is maintained.

The first and second silica powders 13a, 13b together constitute an opaque vitreous silica layer 11, and in particular the first silica powder becomes the first opaque vitreous silica portion 11a and the second silica powder becomes the second opaque vitreous silica portion. Therefore, the first silica powder 13a includes more fine powder than the second silica powder 13b. In contrast, the second silica powder 13b is more porous than the first silica powder 13a and the particle size of the second silica powder 13b is larger than that of the first silica powder 13a. In the present specification, "fine powder" refers to powder constituted from particles each having a diameter of 150 μm or less. Therefore, the phrase "include more fine powder" refers to the state that the ratio of particles each having a diameter of 150 μm or less is larger in the below-mentioned particle size distribution.

In the present embodiment, it is preferred that the first silica powder 13a is natural silica powder including particles having a particle diameter of 50 μm or more and less than 250 μm in an amount of 60% or more, and the particle size distribution of the first silica powder 13a is 5 to 20% for a particle diameter of less than 50 μm, 60 to 80% for a particle diameter of 50

µm or more and less than 250 µm, and 20% or less for a particle diameter of 250 µm or more. Furthermore, the second silica powder 13b is natural silica powder including particles having a particle diameter of 150 µm or more and less than 350 µm in an amount of 60% or more, and the particle size distribution of the second silica powder 13b is 20% or less for a particle diameter of less than 150 µm, 60 to 80% for a particle diameter of 150 µm or more and less than 350 µm, and 10 to 20% for a particle diameter of 350 µm or more.

Next, as shown in FIG. 4, the third silica powder 13c which is a material for the transparent vitreous silica layer 12 is supplied into the mold 14 including a layer of the first and second silica powders 13a, 13b which is a material for the opaque vitreous silica layer 11, to increase the thickness of the silica powder layer (Step S12). The third silica powder 13c is supplied into the entire mold in a predetermined thickness. The third silica powder 13c is preferred to be synthetic silica powder including particles having a particle diameter of 200 µm or more and less than 400 µm in an amount of 50% or more, but it may be natural silica powder. An example of the testing method for the particle diameter and the particle size distribution is JIS K8819-9-3.

The particle size distribution of the above-mentioned silica powder is obtained by use of a laser diffraction/scattering particle size measurement apparatus. The particle size measurement apparatus includes an optical bench, a sample supplier, and a controlling computer. Laser light having a constant wavelength is radiated to particles to obtain the intensity pattern of the scattered light, and the volume-based particle size distribution is calculated by use of the computer based on the intensity pattern. In the case of the laser diffraction/scattering method, when the diffraction/scattering pattern of a certain particle is the same as that of a sphere having a diameter of 1 µm, the diameter of the measured particle is determined to be 1 µm irrespective of the shape. According to the particle size measurement apparatus, it is possible to measure samples, either dry or wet, in optimal conditions by selecting the sample supplier which fits the characteristics of the samples.

Figure 5:
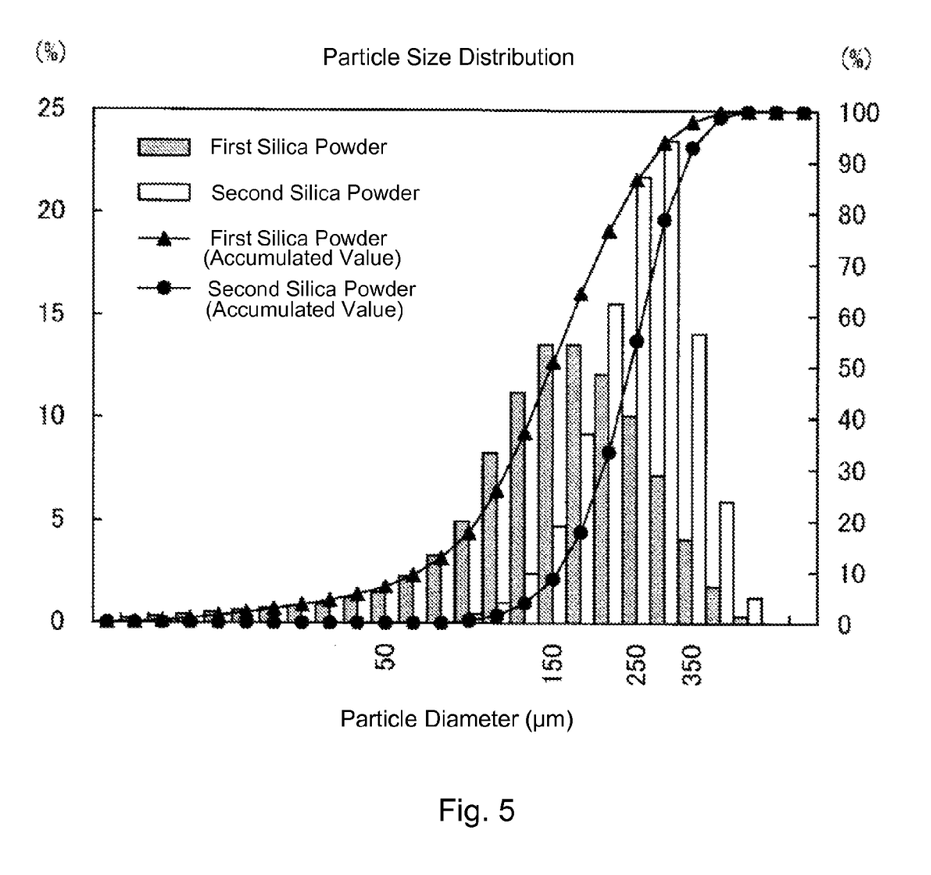
FIG. 5 is a graph showing the particle size distribution of the first and second silica powder 13a, 13b.

FIG. 5 is a graph showing the results of the measurement of the particle size distribution for the first and second silica powders 13a, 13b by use of the above-mentioned laser diffraction/scattering particle size measurement apparatus. In FIG. 5, the horizontal axis indicates the particle diameter (µm) of the silica powder, the left vertical axis indicates abundance ratio (%), and the right vertical axis indicates the accumulated value (%) of the abundance ratio. The bar graph indicates the abundance ratio for each particle diameter, and the curved line graph indicates the accumulated value of the abundance ratio.

As shown in FIG. 5, the first silica powder 13a has a gradual peak at around 140 µm, and the range of the particle size distribution is wide. That is, the particle size distribution of the first silica powder 13a is 5 to 20% for a particle diameter of less than 50 µm, and 60 to 80% for a particle diameter of 50 µm or more and less than 250 µm, and 20% or less for a particle diameter of 250 µm or more. In contrast, the second silica powder 13b has a sharp peak at around 170 µm, and the range of the particle size distribution is narrow. That is, the particle size distribution of the second silica powder 13b is 20% or less for a particle diameter of less than 150 µm, 60 to 80% for a particle diameter of 150 µm or more and less than 350 µm, and 10 to 20% for a particle diameter of 350 µm or more. The range of the particle size distribution is defined by the difference in particle diameter between the particle diameter at the accumulated value 90% and the particle diameter at the accumulated value 10%, and when the difference is large, it is expressed that "the particle size distribution is wide".

Thereafter, arc electrodes 15 are placed in the cavity, and the entire silica powder layer is heated and fused at 1720 degrees C. or more by arc discharge from the inside of the mold. Furthermore, during heating, the silica powder layer is depressurized from the mold side, to suction gas inside the silica powder layer toward the outer layer side through the ventilation holes provided on the mold. The bubbles in the crucible inner surface are removed by deaerating the silica powder layer during heating, to form a transparent vitreous silica layer 12 substantially not containing bubbles (Step S13).

Here, the phrase "substantially not containing bubbles" refers to a state that the bubble content rate and the bubble size are such that the single crystallization yield is not deteriorated due to the bubbles. Although not in particular limited, the phrase "substantially not containing bubbles" may refer to a state that the bubble content rate is 0.1% or less and the average diameter of the bubbles is 100 µm or less. Thereafter, the depressurization for deaeration is weakened or stopped while heating and leaves bubbles to obtain an opaque vitreous silica layer 11 containing a number of microbubbles (Step S14). At this stage, due to difference in the material, the bubble content rate of the first opaque vitreous silica portion 11a becomes higher than that of the second opaque vitreous silica portion 11b, and the specific gravity of the first opaque vitreous silica portion 11a becomes smaller than that of the second opaque vitreous silica portion 11b. Thus, the vitreous silica crucible of the present embodiment is completed.

Thus, in the method of vitreous silica crucible of the present embodiment, the particle size distribution of the material powder for the opaque vitreous silica layer 11 is different in the crucible upper portion and the crucible lower portion in order to form the first opaque vitreous silica portion 11a and the second opaque vitreous silica portion 11b differently. Thus, it is possible to extremely easily form the opaque vitreous silica layer having different specific gravities in the crucible upper portion and the crucible lower portion without local heating or suction to the crucible.

In the above-mentioned first embodiment, the specific gravity of the opaque vitreous silica layer 11 is two steps in the crucible upper portion and the crucible lower portion. However, the present invention is not limited to the two steps, but can be configured to have three or more steps.

Figure 6:
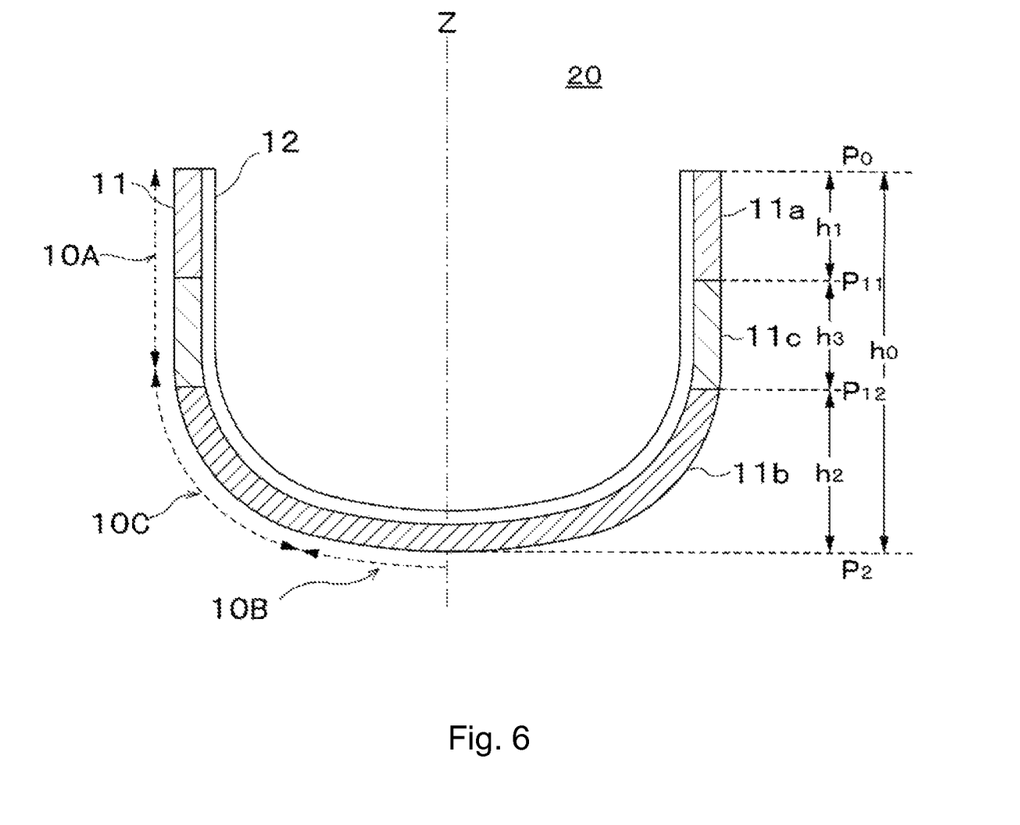
FIG. 6 is a schematic sectional view showing the structure of a vitreous silica crucible 20 of the second embodiment of the present invention.

FIG. 6 is a schematic sectional view showing the structure of a vitreous silica crucible for pulling a silicon single crystal according to the second embodiment of the present invention.

As shown in FIG. 6, the vitreous silica crucible 20 of the present embodiment includes a first opaque vitreous silica portion 11a provided on the crucible upper portion, a second opaque vitreous silica portion 11b provided on the crucible lower portion, and a third opaque vitreous silica portion 11c provided on the crucible middle portion. The bubble content rates and the specific gravities of these portions are different from one another. That is, the change in the specific gravity of the opaque vitreous silica layer 11 is three steps in the height direction, and the specific gravity is larger as the height is lower.

Here, the "crucible upper portion" refers to a portion belonging to a region from the upper end $P_0$ to the first intermediate position $P_{11}$ of the crucible. The "crucible lower portion" refers to a portion belonging to a region below the "crucible upper portion" and from the second intermediate position $P_{12}$ below the first intermediate position $P_{11}$ to the lower end $P_2$ of the crucible. The "crucible middle portion"

refers to a portion belonging to a region from the first intermediate position $P_{11}$ to the second intermediate position $P_{12}$.

In other words, the "crucible middle portion" is a portion other than the "crucible upper portion" and the "crucible lower portion." The "crucible middle portion" can be one step (in this case, the specific gravity does not change within the crucible middle portion) or can be multiple steps (in this case, the specific gravity changes within the crucible middle portion). The border between the "crucible middle portion" and the "crucible lower portion" is the second intermediate position $P_{12}$.

Specifically, it is possible to set the height $h_1$ of the first opaque vitreous silica portion 11a to be 0.3 $h_0$, the height of the second opaque vitreous silica portion 11a to be 0.4 $h_0$, and the height of the third opaque vitreous silica portion 11c to be 0.3 $h_0$. Furthermore, it is also possible to set the height of the first opaque vitreous silica portion 11a to be 0.1 $h_0$, the height of the second opaque vitreous silica portion 11a to be 0.4 $h_0$, and the third opaque vitreous silica portion 11c to be 0.5 $h_0$. All of these specific examples satisfy the condition that the height $h_1$ of the first opaque vitreous silica portion 11a is 0.1 $h_0$ to 0.6 $h_0$ as shown in the first embodiment.

The bubble content rates and the specific gravities of the first and second opaque vitreous silica portions 11a, 11b are the same as the vitreous silica crucible 10 according to the first embodiment. That is, the specific gravity of the first opaque vitreous silica portion 11a is 1.4 to 1.8, and the specific gravity of the second opaque vitreous silica portion 11b is 1.7 to 2.1 and larger than that of the first opaque vitreous silica portion 11a. The bubble content rate and the specific gravity of the third opaque vitreous silica portion 11c is in the middle of the first and second opaque vitreous silica portions 11a, 11b, and is larger than that of the first opaque vitreous silica portion 11a, and is smaller than that of the second opaque vitreous silica portion 11b.

The first silica powder 13a which is the material for the first opaque vitreous silica portion 11a is preferred to be natural silica powder including particles having a particle diameter of 50 μm or more and less than 250 μm in an amount of 60% or more, and the particle size distribution of the first silica powder 13a is preferred to be 5 to 20% for a particle diameter of less than 50 μm, 60 to 80% for a particle diameter of 50 μm or more and less than 250 μm, and 20% or less for a particle diameter of 250 μm or more. Furthermore, the second silica powder 13b which is the material for the second opaque vitreous silica portion 11b is preferred to be natural silica powder including particles having a particle diameter of 150 μm or more and less than 350 μm in an amount of 60% or more, and the particle size distribution of the second silica powder 13b is preferred to be 20% or less for a particle diameter of less than 150 μm, 60 to 80% for a particle diameter of 150 μm or more and less than 350 μm, and 10 to 20% for a particle diameter of 350 μm or more.

Furthermore, the material for the third opaque vitreous silica portion 11c is preferred to be a mixture, in a certain ratio, of the first silica powder 13a and the second silica powder 13b. In this way, it is easy to form the third opaque vitreous silica portion 11c having a specific gravity larger than the first opaque vitreous silica portion 11a and smaller than the second opaque vitreous silica portion 11b.

As explained above, the vitreous silica crucible 20 of the present embodiment includes a crucible middle portion between the crucible upper portion and the crucible lower portion, and the specific gravity of the third opaque vitreous silica portion 11c which is in the crucible middle portion is larger than that of the crucible upper portion and smaller than that of the crucible lower portion. Therefore, the vitreous silica crucible 20 of the present embodiment exhibits the same effect as the first embodiment.

As mentioned above, the preferred embodiments of the present invention have been described. The present invention is not in particular limited to the above-mentioned embodiments, and various modifications are possible as long as the modification does not depart from the spirit of the present invention, and those modifications are within the scope of the present invention.

EXAMPLE

Example 1

A vitreous silica crucible sample A1 having an opening diameter of 812 mm was prepared. The vitreous silica crucible sample A1 had a diameter of 812 mm and a height of 500 mm. The wall thickness of the crucible is 18 mm on the sidewall portion, 20 mm on the curved portion, and 18 mm on the bottom portion. The thickness of the transparent vitreous silica layer 12 on the sidewall portion was 1.0 mm.

The vitreous silica crucible sample A1 was manufactured by the rotating mold method, and natural silica powder including particles having a particle diameter of 50 μm or more and less than 250 μm in an amount of 60% was used as the material for the first opaque vitreous silica portion 11a, and natural silica powder including particles having a particle diameter of 150 μm or more and less than 350 μm in an amount of 60% was used as the material for the second opaque vitreous silica portion 11b. Furthermore, synthetic silica powder including particles having a particle diameter of 200 μm or more and less than 400 μm in an amount of 60% was used as the material for the transparent vitreous silica layer 12. The particle size distributions of the above-mentioned material powders were measured by use of a laser diffraction/scattering particle size measurement apparatus. The particle size measurement apparatus calculates the volume-based particle size distribution based on the intensity pattern of scattered light, obtained by radiating laser light having a constant wavelength to particles.

By use of another sample manufactured in the same conditions as the crucible sample A1, the specific gravities of the first and second opaque vitreous silica portion 11a, 11b were measured, and the specific gravity of the first opaque vitreous silica portion 11a was 1.62, and the specific gravity of the second opaque vitreous silica portion 11b was 1.86.

Next, 300 kg of polysilicon blocks was supplied into the vitreous silica crucible, and thereafter, the vitreous silica crucible was mounted on a silicon crystal pulling apparatus, and the polysilicon in the crucible was melted in a furnace, to pull a silicon single crystal ingot having a diameter or about 300 mm.

Thereafter, the crucible deformation after use was inspected. Furthermore, the single crystallization yield of the pulled silicon single crystal was determined. The results are shown in Table 1. The single crystallization yield was defined as the weight ratio of the silicon crystal with respect to silicon material. However, not all silicon melt in the crucible was used and only the straight body portion except the top portion and the tale portion was included in the calculation of the single crystallization yield, and thus the single crystallization yield was 100% or less even when sufficient silicon single crystal was pulled. Therefore, the single crystallization yield of 80% or more is fairly good.

As shown in Table 1, in the vitreous silica crucible sample A1 of Example 1, the sidewall lowering of the crucible after the pulling hardly occurred. Furthermore, the single crystallization yield of a silicon ingot pulled by use of the vitreous silica crucible A1 was 88%, and thus the single crystallization yield was good.

Comparative Example 1

A sample B1 having the same shape as the vitreous silica crucible sample A1 of Example 1 was prepared. The sample B1 was manufactured by the rotating mold method, but unlike Example 1, natural silica powder including particles having a particle diameter of 100 µm or more and less than 300 µm in an amount of 60% was used as the material for the first opaque vitreous silica portion 11a, and natural silica powder including particles having a particle diameter of 200 µm or more and less than 400 µm in an amount of 60% was used as the material for the second opaque vitreous silica portion 11b. Furthermore, synthetic silica powder including particles having a particle diameter of 250 µm or more and less than 450 µm in an amount of 60% was used as the material for the transparent vitreous silica layer 12. Therefore, a silicon single crystal ingot was pulled by use of the vitreous silica crucible sample A2, and the crucible deformation after use was inspected, and the silicon single crystallization yield was determined. The results are shown in Table 1.

As shown in Table 1, in the vitreous silica crucible sample B1 in Comparative Example 1, the sidewall lowering after use was about 40 mm. Furthermore, the single crystallization yield of the silicon ingot pulled by use of this vitreous silica crucible sample B1 was 62%, and thus the single crystallization yield was much lower.

TABLE 1

| Particle | | Particle Size Distribution of Material Silica Powder (%) | | | | | Single |
|---|---|---|---|---|---|---|---|
| | Diameter (µm) | 50 or Less | 50 to 150 | 150 to 250 | 250 to 350 | 350 or More | Sidewall Lowering | Crystallization Yield (%) |
| Ex. A1 | Crucible Upper Portion | 15 | 40 | 30 | 10 | 5 | None | 88 |
| | Crucible Lower Portion | 5 | 10 | 35 | 35 | 15 | | |
| Comp. Ex. B1 | Crucible Upper Portion | 5 | 10 | 40 | 30 | 15 | 40 mm | 62 |
| | Crucible Lower Portion | 5 | 10 | 35 | 35 | 15 | | |

EXPLANATION OF REFERENCE SYMBOL

10 Vitreous Silica Crucible
10A Sidewall Portion of Crucible
10B Bottom Portion
10C Curved Portion of Crucible
11 Opaque Vitreous Silica Layer
11a First Opaque Vitreous Silica Portion
11b Second Opaque Vitreous Silica Portion
11c Third Opaque Vitreous Silica Portion
12 Transparent Vitreous Silica Layer
13a First Silica Powder
13b Second Silica Powder
13c Third Silica Powder
14 Carbon Mold
14a Ventilation Hole
15 Arc Electrode
10 Vitreous Silica Crucible
$h_0$ Height of Entire Crucible
$h_1$ Height of Crucible Upper Portion
$h_2$ Height of Crucible Lower Portion
$h_3$ Height of Crucible Middle Portion
$P_0$ Crucible Upper End
$P_{11}$ First Intermediate Position of Crucible
$P_{12}$ Second Intermediate Position of Crucible
$P_2$ Crucible Lower End

The invention claimed is:

1. A vitreous silica crucible for pulling a silicon single crystal, the crucible having a sidewall portion, a curved portion, and a bottom portion, and having an opaque vitreous silica layer provided on an outer surface side of the crucible and containing numerous bubbles and a transparent vitreous silica layer provided on an inner surface side of the crucible, wherein
   the opaque vitreous silica layer has a first opaque vitreous silica portion provided on a crucible upper portion belonging to a range from a crucible upper end to a first intermediate position below the upper end, and a second opaque vitreous silica portion provided on a crucible lower portion belonging to a range from the first intermediate position to a crucible lower end or a range from a second intermediate position below the first intermediate position to the crucible lower end,
   a height $h_1$ of the first opaque vitreous silica portion is $0.1h_0$ to $0.6h_0$, where $h_0$ is a height of the entire crucible,
   a specific gravity of the second opaque vitreous silica portion is 1.7 to 2.1, and a specific gravity of the first opaque vitreous silica portion is 1.4 to 1.8, and smaller than that of the second opaque vitreous silica portion,
   the OH group content of the opaque vitreous silica layer including both first and second opaque vitreous silica portions provided as the upper portion and lower portion, respectively, is less than 60 ppm, and
   at a position approximately 30 µm toward the outer surface side from a position where a bubble content rate of the transparent vitreous silica layer starts to increase, the bubble content rate reaches a bubble content rate of the opaque vitreous silica layer.

2. A method of manufacturing a vitreous silica crucible having a sidewall portion, a curved portion and a bottom portion, and having:
   (1) a process of supplying silica powder into a hollow mold having an inner surface corresponding to a shape of the vitreous silica crucible while rotating the mold, to form a silica powder layer along the inner surface of the mold, and (2) a process of heating the silica powder layer to fuse the silica powder and form a vitreous silica layer, wherein the process (1) includes:

a process of supplying a first silica powder on a position corresponding to a crucible upper portion belonging to a range from a crucible upper end to a first intermediate position below the upper end, a process of supplying a second silica powder on a position corresponding to a crucible lower portion belonging to a range from the first intermediate position to a crucible lower end or a range from a second intermediate position below the first intermediate position to the crucible lower end, and a process of supplying a third silica powder on a crucible inner surface covered with the first and second silica powder, wherein a particle size distribution of the first silica powder is wider than that of the second silica powder and the first silica powder includes more fine powder than the second silica powder.

3. The method of claim 2, wherein the first silica powder is natural silica powder including particles having a particle diameter of 50 μm or more and less than 250 μm in an amount of 60% or more, and the second silica powder is natural silica powder including particles having a particle diameter of 150 μm or more and less than 350 μm in an amount of 60% or more.

4. The method of claim 3, wherein a particle size distribution of the first silica powder is 5 to 20% for a particle diameter of less than 50 μm, 60 to 80% for a particle diameter of 50 μm or more and less than 250 μm, and 20% or less for a particle diameter of 250 μm or more, and a particle size distribution of the second silica powder is 20% or less for a particle diameter of less than 150 μm, 60 to 80% for a particle diameter of 150 μm or more and less than 350 μm, and 10 to 20% for a particle diameter of 350 μm or more.

5. The method of claim 2, wherein the third silica powder is synthetic silica powder including particles having a particle diameter of 200 μm or more and less than 400 μm in an amount of 50% or more.

6. The method of claim 2, the process of heating the silica powder layer to fuse the silica powder includes:

a process of forming a transparent vitreous silica layer on an inner surface side of the crucible by deaerating the silica powder during heating from ventilation holes provided in the mold, and a process of forming an opaque vitreous silica layer on an outer surface side of the crucible by weakening or stopping depressurization for the deaeration.

* * * * *